United States Patent
Lai et al.

(10) Patent No.: US 8,719,000 B2
(45) Date of Patent: May 6, 2014

(54) SHOOTING PNOISE CIRCUIT SIMULATION WITH FULL SPECTRUM ACCURACY

(75) Inventors: Xiaolue Lai, San Jose, CA (US); Yu Zhu, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 246 days.

(21) Appl. No.: 13/247,983

(22) Filed: Sep. 28, 2011

(65) Prior Publication Data

US 2013/0080126 A1 Mar. 28, 2013

(51) Int. Cl.
*G06F 17/50* (2006.01)

(52) U.S. Cl.
USPC .............. 703/14; 703/2; 702/190; 716/136

(58) Field of Classification Search
USPC ............... 702/69; 703/2, 13, 14; 716/115; 364/574, 802, 803
See application file for complete search history.

(56) References Cited

U.S. PATENT DOCUMENTS

| | | | |
|---|---|---|---|
| 6,072,947 A * | 6/2000 | Roychowdhury et al. | 703/14 |
| 6,671,663 B1 * | 12/2003 | Hellums et al. | 703/14 |
| 8,473,533 B1 * | 6/2013 | Mehrotra et al. | 708/200 |
| 2010/0017186 A1 * | 1/2010 | Kim et al. | 703/14 |

OTHER PUBLICATIONS

Analog FastSPICE RF: Full-Spectrum RF Analyses for Nanometer-scale Integrated Circuits, Copyright 2009, Berkeley Design Automation, Inc.*

Oliveira et al., A New Mixed Time-Frequency Simulation Method for Nonlinear Heterogeneous Multirate RF Circuits, IEEE MTT-S Int. Microw. Symp. Dig., Anaheim, CA, May 2010, pp. 548-551.*

Pavlic, ECE 209: Circuits and Electronics Laboratory, Review of Circuits as LTI Systems, Copyright 2007-2011.*

Phillips, Model Reduction of Time-Varying Linear Systems Using Approximate Multipoint Krylov-subspace Projectors, Proc. IEEE/ACM Int. Conf. Computer-Aided Design, 1998, pp. 96-102.*

Sung et al., A Transient Noise Model for Frequency-Dependent Noise Sources, IEEE Transactions on Computer-aided Design of Integrated Circuits and Systems, vol. 22, No. 8, Aug. 2003.*

* cited by examiner

*Primary Examiner* — Mary C Jacob
*Assistant Examiner* — Michael P Healey
(74) *Attorney, Agent, or Firm* — Kenyon & Kenyon LLP

(57) ABSTRACT

An apparatus and method for performing periodic noise (Pnoise) simulation with full spectrum accuracy is disclosed herein. Noise contributions of a circuit under consideration are identified and separated for different computation treatment. The different computation treatment results in computational efficiency without sacrificing accuracy of simulation results.

33 Claims, 12 Drawing Sheets

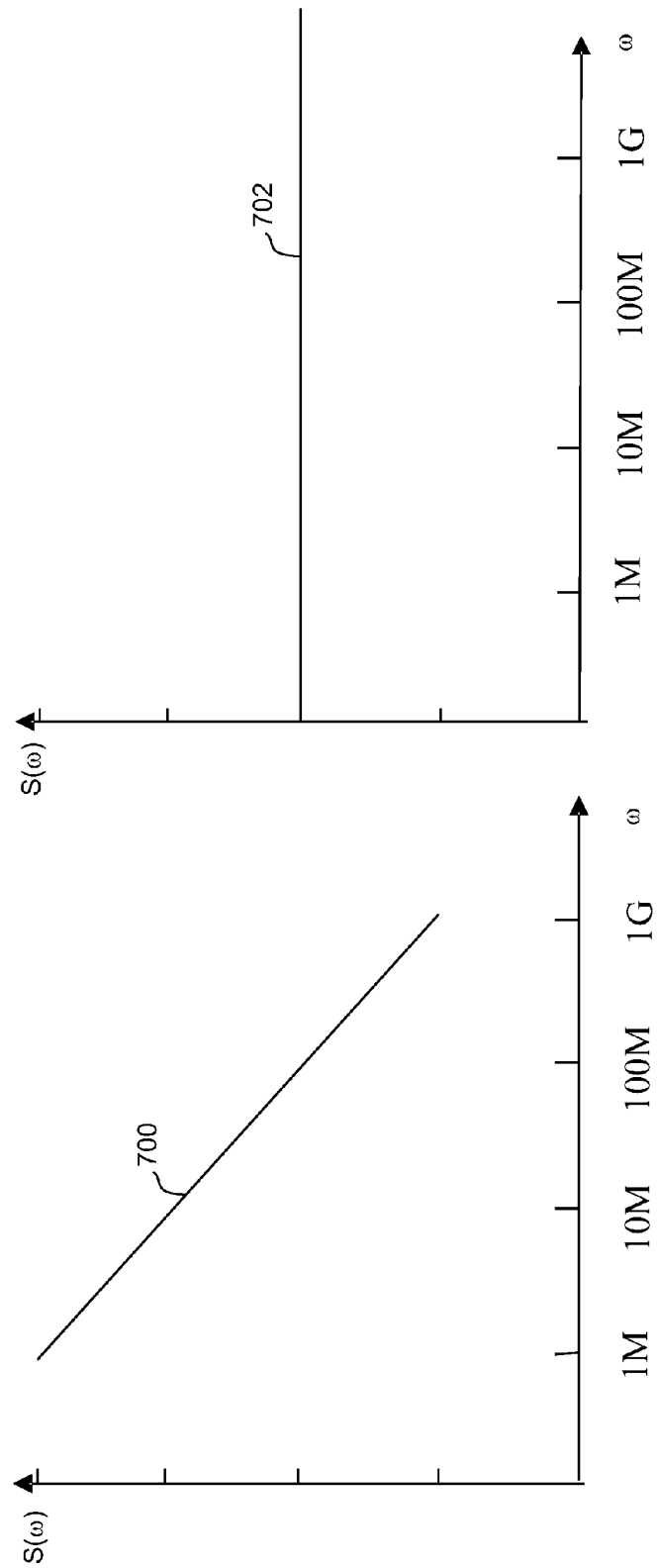

SHOOTING PNOISE CIRCUIT SIMULATION WITH FULL SPECTRUM ACCURACY

BACKGROUND

The present invention relates to the field of simulations. More particularly, the present invention relates to circuit noise simulations.

Simulations are used to model physical devices to facilitate device design, prototyping, and/or testing. A computer system typically runs simulations by executing a set of instructions or code representative of devices and the functionalities/interactions that occur between these devices. A modeled device may comprise a component on an integrated chip (e.g., a resister, transistor, processor, bus, clock memory, etc.), the entire integrated circuit (IC), a system including an IC, or other components of an electronic system.

Once a model representative of a device has been generated, various properties of the device, including its interaction with other modeled device(s), can be analyzed within the simulation environment. The collection of one or more modeled devices (also referred to as a modeled system) is analyzed by subjecting it to various known inputs and studying the outputs. Given the complexity of devices represented by the modeled system, a number of different analyses are typically performed to fully understand device properties and behaviors.

One of the analyses typically performed on modeled systems is noise analysis. Noise analysis aims to study noises inherently generated by the devices being modeled. For example, when a circuit comprising a plurality of devices (e.g., resisters, capacitors, inductors, transistors, etc.) is the modeled system, the noise inherently or internally generated from each of the devices may be simulated to analyze the overall noise for the circuit. For a radio frequency (RF) circuit operated with excitation of a large signal, the noise of each of the individual devices comprising the circuit is treated as a small signal (a signal much smaller in magnitude than the large signal) which perturbs the large signal solution for the circuit. Hence, noise analysis for RF circuits is a two-step process. The first step comprises performing a periodic steady state (PSS) analysis which solves for a large steady state solution. The second step comprises a periodic noise (Pnoise) analysis using the large steady state solution and treating each device noise as a small signal.

With Pnoise analysis, a specific input noise is injected into the modeled system causing it to generate an output noise having a number of sidebands each around an integer-multiple of the large signal frequency in the frequency domain. Ideally all the sidebands of the output noise would be simulated so that they are all taken into account to provide an accurate simulation of the circuit Pnoise. In practice, however, simulating all the sidebands of the output noise is computationally challenging due to the large number of sidebands. For simple RF circuits (e.g., some narrowband RF circuits), the computation load is managed by only simulating a small number of sidebands (e.g., 10 to 20 sidebands). The contribution of sidebands beyond the initial small number of sidebands is minimal and can be ignored without sacrificing accuracy of the total output noise. For more complex RF circuits (e.g., broadband digitally-switched circuits such as input/output buffers or frequency dividers), contribution of sidebands beyond the initial 10 to 20 sidebands is not negligible. To obtain an accurate total output noise requires taking into account a large number of sidebands (e.g., several thousand sidebands). Computations required to simulate upwards of several thousand sidebands may take one, two, or more days to complete.

With the goal of increasing design productivity, designers may be tempted to select simulation parameters that will result in faster simulation results. One such parameter selection is to specify the number of sidebands to take into account for the Pnoise analysis (e.g., specifying a maximum sideband value). While selecting a small maximum sideband value is fine for certain type of circuits, it can seriously impact the accuracy of simulation results for other types of circuits as discussed above. If the circuit being modeled has, in fact, non-negligible contributions from sidebands beyond the initial small number of sidebands and the designer is not aware of this (or does not have time to run a multi-day simulation), the resulting simulation results may be inaccurate and not particularly useful. The designer may not even be aware that the simulation results are inaccurate, which negatively impacts the circuit design process.

Thus, it would be beneficial to provide accurate Pnoise simulation results without a high computation cost. It would be further beneficial to provide a simulation tool requiring less knowledge by designers while automatically providing accurate simulation results.

BRIEF SUMMARY

An apparatus and method for performing periodic noise (Pnoise) simulation with full spectrum accuracy is disclosed herein. Noise contributions of circuit under consideration are identified and decomposed into at least a flicker noise contribution and a white noise contribution. Taking advantage of the noise strength profiles of each of the flicker noise contribution and white noise contribution, computational savings are realized. In particular, an output noise associated with the flicker noise contribution is determined based on a small number of sidebands in the frequency domain. The output noise associated with the white noise contribution is determined for a − infinity to + infinity of sidebands in the time domain. The sum of the output noises associated with each of the flicker noise contribution and white noise contribution represents the total output noise from the full-spectrum Pnoise analysis for the circuit. Accordingly, computation cost to obtain the total output noise is low without sacrificing accuracy.

Other features and aspects of the invention will become apparent from the following detailed description, taken in conjunction with the accompanying drawings which illustrate, by way of example, the features in accordance with the embodiments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 7A-7B illustrates exemplary waveforms representative of the flicker noise and white noise, respectively.

Figure 1:
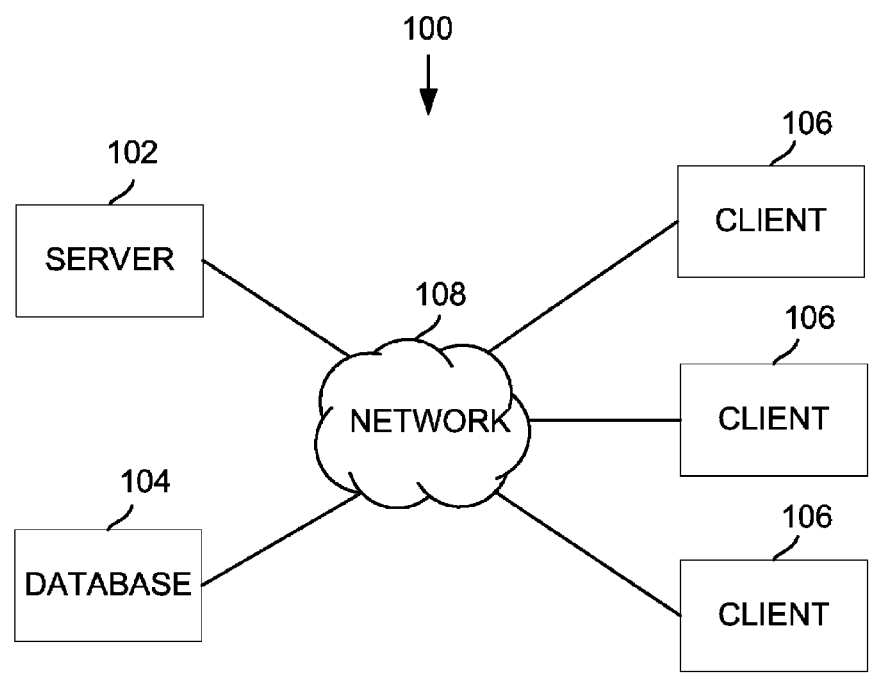
FIG. 1 illustrates an exemplary system for providing computationally efficient and accurate Pnoise simulations according to some embodiments.

The headings provided herein are for convenience only and do not necessarily affect the scope or meaning of the terms used.

DETAILED DESCRIPTION

Described in detail below is an apparatus and method for performing Pnoise simulation with full spectrum accuracy that is computationally efficient without sacrificing accuracy of results. The noise contributions of the circuit under consideration are identified and decomposed into at least a flicker noise contribution and a white noise contribution. Taking advantage of the noise strength profiles of each of the flicker noise contribution and white noise contribution, computational savings are realized. In particular, an output noise associated with the flicker noise contribution is determined based on a small number of sidebands in the frequency domain. The output noise associated with the white noise contribution is determined for a − infinity to + infinity of sidebands in the time domain. The sum of the output noises associated with each of the flicker noise contribution and white noise contribution represents the total output noise from the full-spectrum Pnoise analysis for the circuit.

The following description is presented to enable any person skilled in the art to create and use a computer system configuration and related method and article of manufacture to determine the total output noise of a circuit being modeled within a circuit simulation environment. In some embodiments, the noise contributions from the circuit are analyzed to decompose into simpler and computationally advantageous components. The particular noise strength profile of each of the decomposed noise components facilitates reduced number of computations, resulting in orders of magnitude speed over traditional Pnoise simulations without a reduction in accuracy of the calculated total output noise. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Simulations are used to model physical devices to facilitate device design, prototyping, and/or testing. A computer system typically runs simulations by executing a set of instructions or code representative of devices and the functionalities/interactions that occur between these devices. A modeled device may comprise a component on an integrated chip (e.g., a resister, transistor, processor, bus, clock memory, etc.), the entire integrated circuit (IC), a system including an IC, or other components of an electronic system. Once a model representative of a device has been generated, various behaviors of the device, including its interaction with other modeled device(s), can be analyzed within the simulation environment.

An example of electronic systems that can be modeled is circuits comprising a plurality of devices or components (e.g., resisters, transistors, and the like). In particular, radio frequency (RF) circuits, oscillators, mixers, phase lock loop (PLL) circuits, or circuits that exhibit a periodic behavior with sideband noise (collectively referred to as RF circuits) may be modeled and their behavior and properties simulated within a simulation environment. In order to analyze the noise properties of a RF circuit design, one of the simulations performed is a periodic noise (Pnoise) simulation. Also referred to as Pnoise analysis, shooting Pnoise simulation, shooting Pnoise analysis, small signal noise simulation, or small signal noise analysis, such simulation is carried out by a computing system as shown in FIG. 1.

FIG. 1 illustrates an exemplary system 100 for providing computationally efficient and accurate Pnoise simulation of RF circuits according to some embodiments. System 100 includes a server 102, a database 104, one or more clients 106, and a network 108. Each of server 102, database 104, and clients 106 is in communication with network 108.

Server 102 comprises one or more computers or processors configured to communicate with clients 106 via network 108. Server 102 may be located at one or more geographically distributed locations. Server 102 hosts one or more applications accessed by clients 106 and/or facilitates access to the content of database 104. Database 104 comprises one or more databases configured to communicate with server 102 and/or clients 106 via network 108. Although not shown, database 104 may also communicate with server 102 without needing network 108. Database 104 may be located at one or more geographically distributed locations from each other and also from server 102. Alternatively, database 104 may be included within server 102. Database 104 comprises a storage device for storing data and/or instructions for use by server 102 and/or clients 106.

Each of clients 106 comprises a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multi-processor systems, microprocessor-based or programmable consumer electronics, game consoles, set-top boxes, network PCs, mini-computers, and the like. Clients 106 include applications (e.g., web browser application such as Internet Explorer, Firefox, Safari, etc.) or other necessary interface capabilities to communicate with server 102 and database 104 via network 108. Clients 106 may be located geographically dispersed from each other, server 102, and/or database 104. Although three clients 106 are shown in FIG. 1, more or less than three clients may be included in system 100. Device or circuit designers access the simulation environment capable of providing Pnoise simulation via clients 106.

Network 108 comprises a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, or a combination of two or more such networks. When network 108 comprises a public network, security features (e.g., VPN/SSL secure transport) may be included to ensure authorized access within system 100.

The simulation environment capable of providing Pnoise simulation (also referred to as the Pnoise simulator or simulation tool) may be hosted by one or more components within system 100. In one embodiment, the Pnoise simulation tool is hosted on server 102 and is remotely accessed by clients 106 via network 108. In another embodiment, the tool resides locally on clients 106. Server 102 may be involved for purposes of updating and/or monitoring the tool on clients 106, and/or to facilitate interaction with database 104 by clients 106. In still another embodiment, a portion of the tool may reside at server 102 and another portion of the tool may reside at clients 106.

Alternatively, clients 106 may be standalone stations not connected to a network. In this case, database 104 (or similar functionality) may be included in clients 106 to provide information used by the tool, as described in detail below. In yet another alternative, the tool may be implemented on a peer-to-peer network rather than the server-client model shown in FIG. 1.

In one embodiment, the computationally efficient Pnoise simulation details described herein is implemented as part of a larger simulator (a simulation product or service) that is capable of running different types of simulations. For example, the simulator may be configured to perform a shooting simulation and also the full spectrum Pnoise simulation described below. In another embodiment, the full spectrum Pnoise simulation functionalities may be implemented as a tool separate from the simulator itself. In this case, the tool includes code to model the circuit (or is otherwise able to obtain the modeling information from another source such as the simulator), transfer functions, and/or other information necessary to perform the specific Pnoise analysis.

Figure 2:
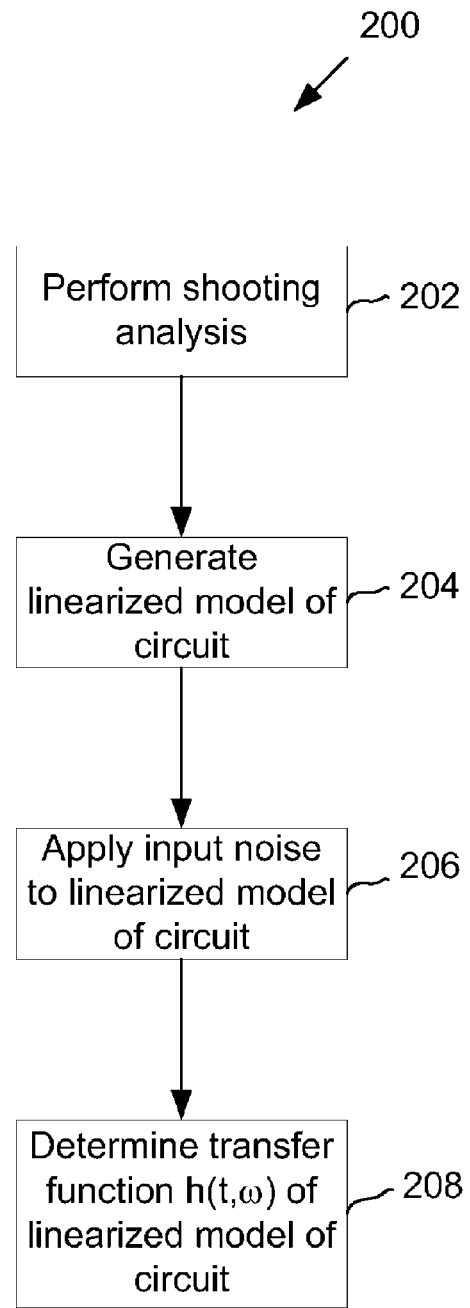
FIG. 2 illustrates an exemplary flow diagram for obtaining pre-cursor information to perform the computationally efficient and accurate Pnoise simulations according to some embodiments.

FIG. 2 illustrates an exemplary flow diagram 200 for obtaining pre-cursor information to perform the full spectrum Pnoise analysis according to some embodiments. Before Pnoise analysis can be performed on a circuit, a large signal periodic steady state (PSS) analysis is performed (block 202). This large signal PSS analysis, also referred to as PSS analysis, shooting analysis, or shooting method, involves determining the periodic steady state response of a model representative of the circuit under consideration when driven by a known periodic signal. The type of RF circuit may dictate the excitation signal. For example, mixers are excited by a local oscillation (LO) signal, power amplifiers are excited by a modulated carrier signal, oscillators by their own inherent oscillating signal, and the like. In one embodiment, the shooting analysis may be conducted as described in U.S. Pat. No. 6,636,839 entitled "Method for Determining the Steady State Behavior of a Circuit Using a Iterative Technique" owned by Cadence Design Systems, Inc. of San Jose, Calif., which is incorporated by reference herein in its entirety. The shooting analysis may be implemented by one or more components within system 100.

Figure 3:
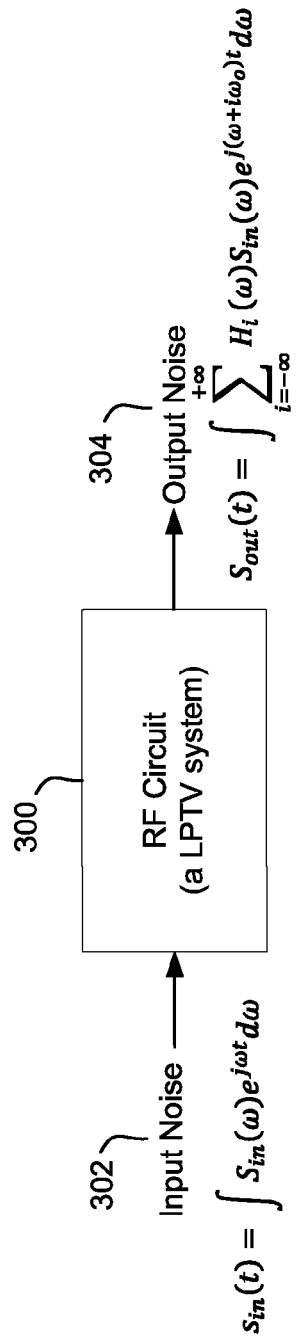
FIG. 3 illustrates an exemplary block diagram of a linearized model circuit according to some embodiments.

Next at a block 204, the output of the shooting analysis is used to generate a linearized model circuit 300. As illustrated in FIG. 3, an exemplary block diagram is shown of the linearized model circuit 300 according to some embodiments. The linearized model circuit 300 comprises a RF circuit that is modeled as a linear periodical time varying (LPTV) circuit or system. The linearized model circuit 300 represents a model of the circuit design at least for purposes of conducting the Pnoise analysis.

When the linearized model circuit 300 is driven by an input noise 302 (block 206), the response of circuit 300 is an output noise 304. Assume that the input noise 302 comprises $s(t)=e^{j\omega t}$ in the time domain. Then the output noise 304 comprises $h(t,\omega)e^{j\omega t}$, where $h(t,\omega)$ is a periodic function having the same period as that of the large signal excitation in the large signal PSS analysis. $h(t,\omega)$ is referred to as a time-varying transfer function, and represents the small signal noise behavior or property profile of the LPTV circuit 300. The time-varying transfer function $h(t,\omega)$ is a periodic function with respect to time t. The Fourier series of $h(t,\omega)=\Sigma H_i(\omega)e^{ji\omega_o t}$, where $H_i(\omega)$ is the i-th harmonic transfer function in the frequency domain. $H_i(\omega)$ represents the circuit response at $\omega+i\omega_o$ when the input noise 302 is $s(t)=e^{j\omega t}$.

In one embodiment of block 208, transfer function $h(t,\omega)$ may be obtained using the recycled Krylov-subspace method described in "*Efficient AC and Noise Analysis of Two-Tone RF Circuits*," R. Telichevesky, et al., 33$^{rd}$ Design Automation Conference, Las Vegas, Nev., June 1996, which is incorporated by reference herein in its entirety. In this paper, $v_s(t)$ in Equation 4 corresponds to the transfer function $h(t,\omega)$. Alternatively, the transfer function $h(t,\omega)$ may be obtained using a different method. The transfer function can be stored in a storage device included in system 100, such as database 104 for later retrieval.

As shown in FIG. 3, each of the input noise 302 and output noise 304 can be represented in the time domain and in the frequency domain. In particular, input noise 302 is represented as $s_{in}(t)$ in the time domain and $S_{in}(\omega)$ in the frequency domain. Output noise 304 in the time domain is expressed as $$S_{out}(t) = \int_{t=-\infty}^{+\infty} \sum H_i(\omega) S_{in}(\omega) e^{j(\omega+i\omega_o)t} d\omega,$$

and the corresponding output noise in the frequency domain is $H_i(\omega)S_{in}(\omega)$ around each $i\omega_o$.

Figure 4:
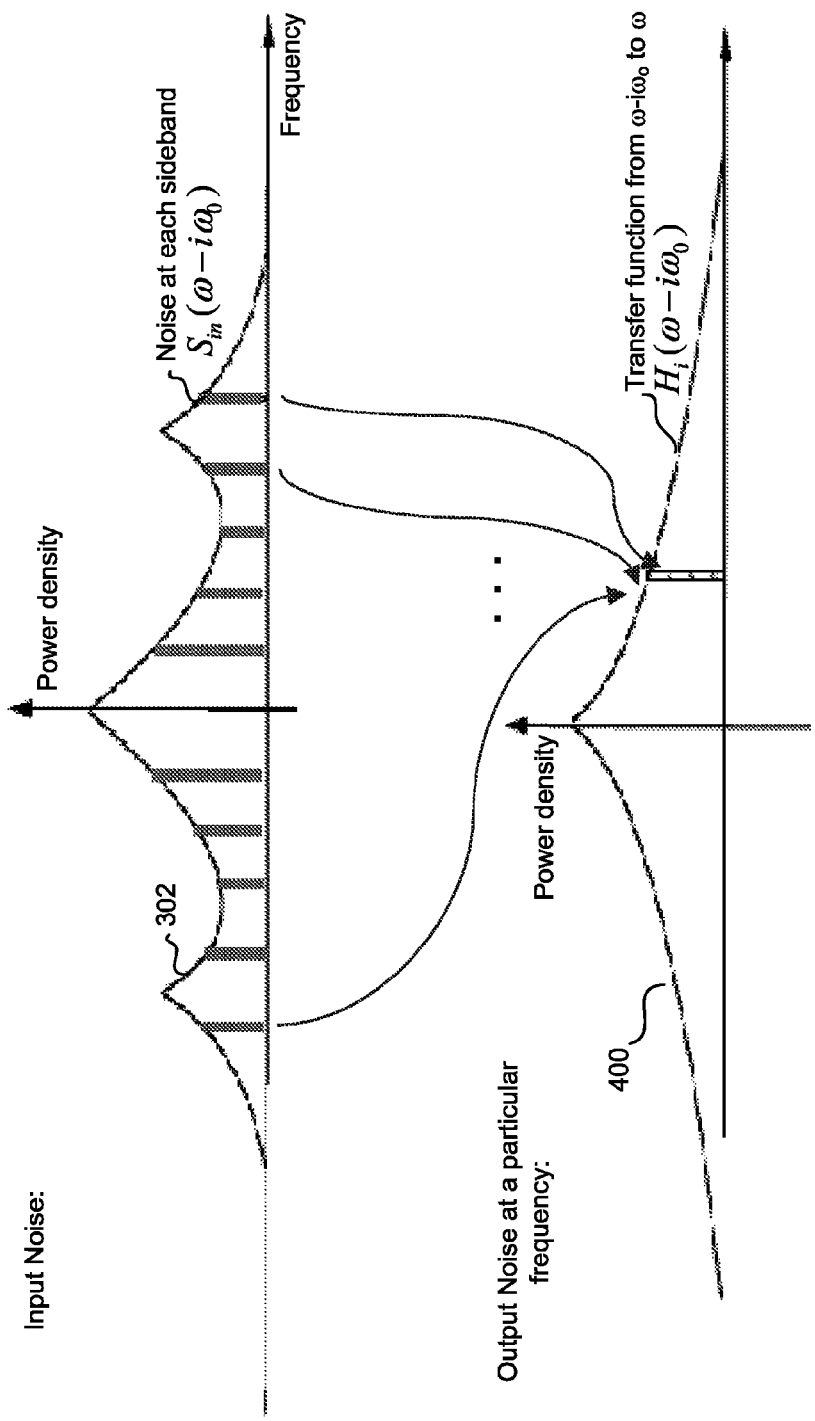
FIG. 4 illustrates exemplary waveforms representative of input noise and output noise included in FIG. 3.

Exemplary waveforms representative of input noise 302 and output noise 304 are shown in FIG. 4. Note that the waveforms shown in FIG. 4 are provided for illustration purposes and do not necessarily represent the actual waveform shapes of the input or output noise. The top waveform represents a graphical depiction of the input noise 302 in the frequency domain. At each sideband $\omega-i\omega_o$, the input noise $S_{in}$ has a certain power density. A bottom waveform 400 represents a graphical depiction of the output noise 304 at a particular frequency $\omega$. The input noise contributions from all the sidebands are multiplied with the corresponding i-th harmonic transfer functions $H_i(\omega)$ to generate the output noise in the frequency domain at frequency $\omega$. A waveform different from waveform 400 exists for each frequency different from frequency $\omega$. When all of these different output noises at different frequencies are summed together, a total output noise $N_{out}(\omega)$ of the circuit 300 can be expressed as:

$$N_{out}(\omega) = \sum_{i=-M}^{M} |H_i(\omega - i\omega_0)|^2 S_{in,i}(\omega - i\omega_0) \quad \text{(Eq. 1)}$$

where $H_i$ is the transfer function or gain of the circuit at the i-th sideband, $S_{in,i}$ is the input noise at the i-th sideband, and M is the maximum sideband number.

In Eq. 1, if the gain $H_i$ decays very slowly as sideband number i increases, a large number of $H_i$ should be calculated (the maximum sideband value M should be a large number) in order to obtain an accurate total output noise $N_{out}(\omega)$. However, calculating a large number of $H_i$ is computationally extensive and consequently takes a long time (e.g., one, two, or more days) for the calculation to complete.

Figure 5A:
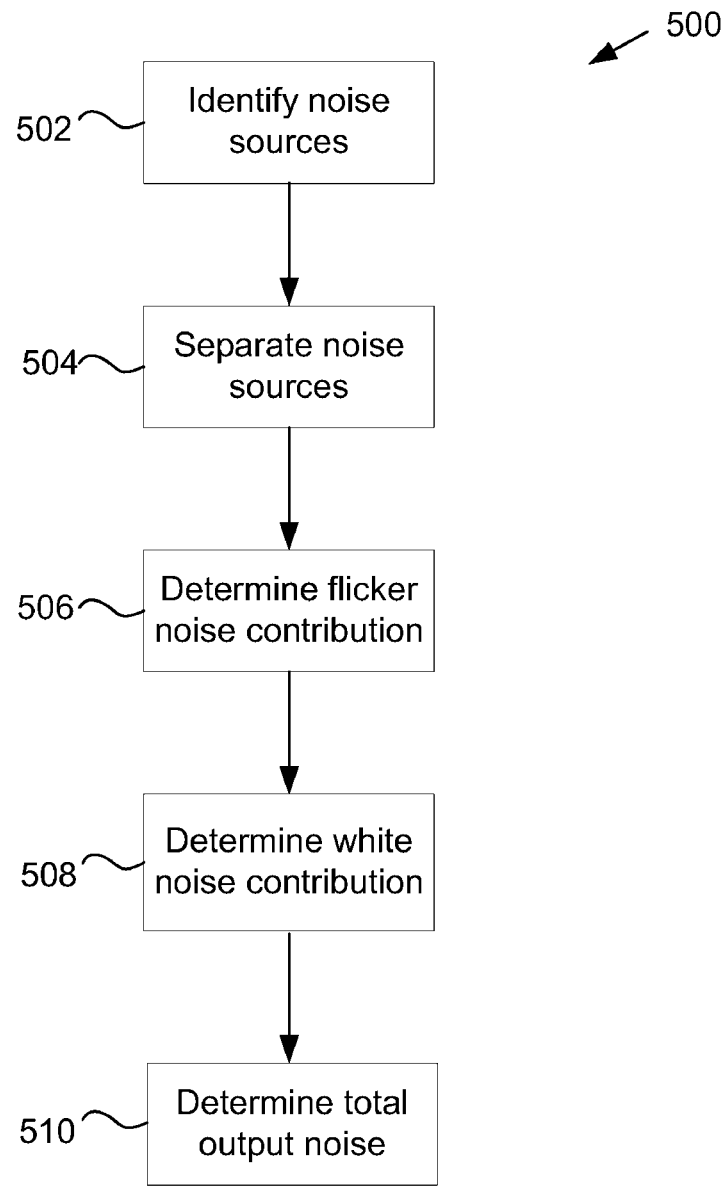
FIGS. 5A-5C illustrates an exemplary flow diagram for determining the total output noise $N_{out}(\omega)$ according to some embodiments.
Figure 5B:
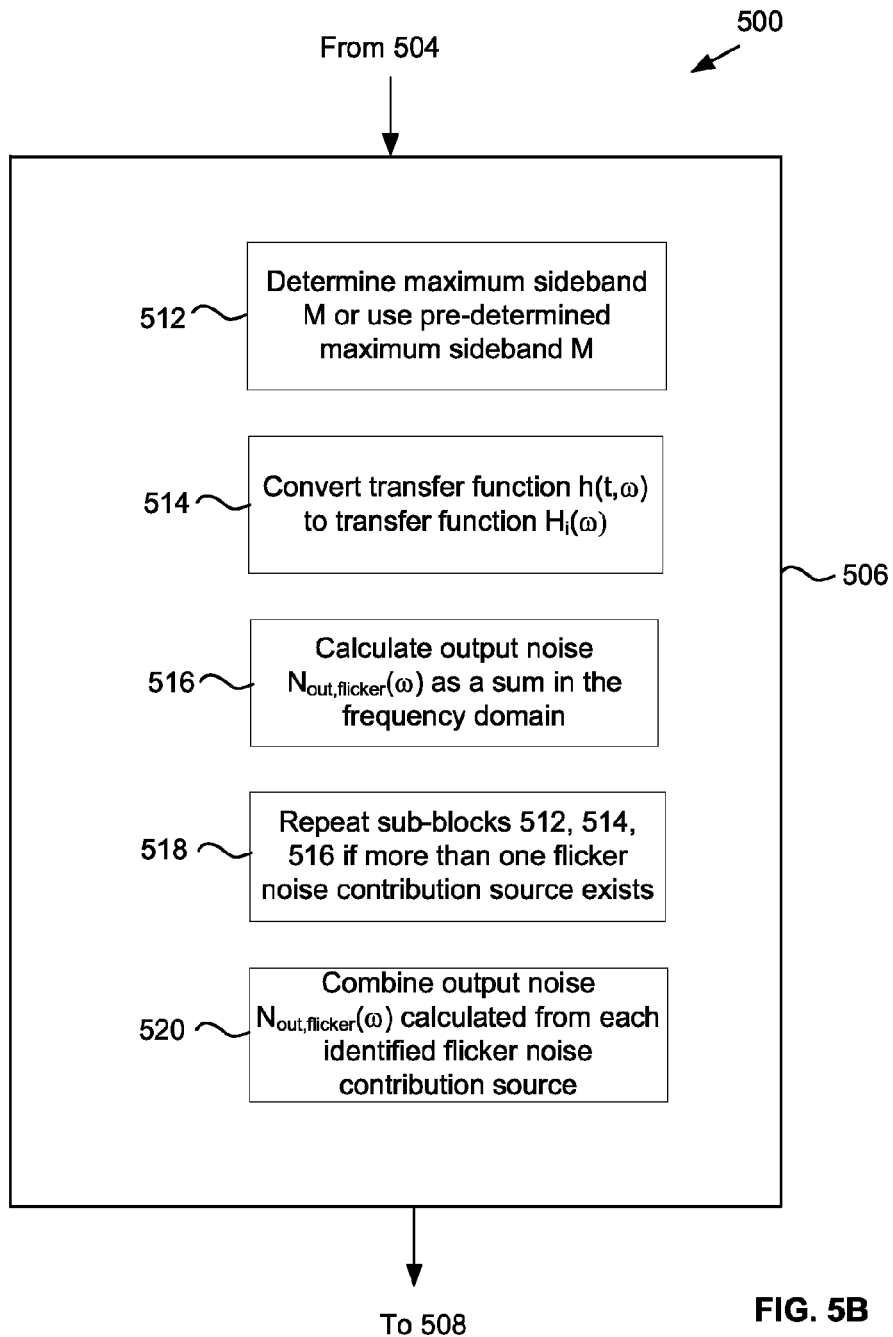
Figure 5C:
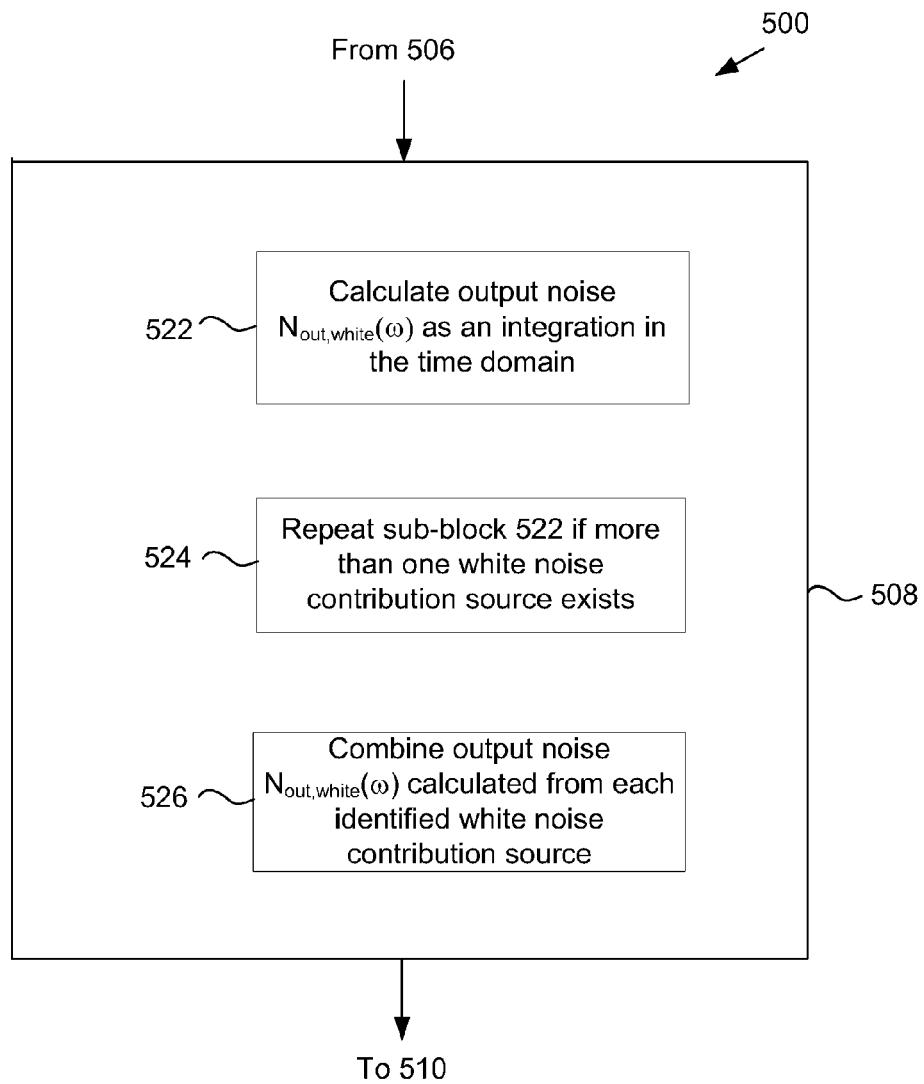
Figure 6:
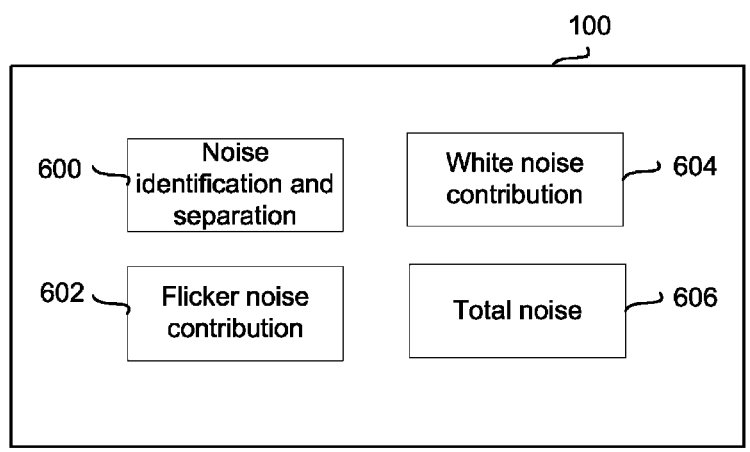
FIG. 6 illustrates an exemplary block diagram showing modules configured to perform the process of FIGS. 5A-5C.

Instead, the Pnoise simulation provided herein provides accurate total output noise determination with low computation cost. FIGS. 5A-5C illustrate an exemplary flow diagram 500 for determining the total output noise $N_{out}(\omega)$ according to some embodiments. The total output noise $N_{out}(\omega)$ is also referred to as the output noise 304 or the Pnoise output. FIG. 6 illustrates a block diagram showing modules configured to perform the process of flow diagram 500. The modules of FIG. 6 comprise conceptual modules that represent instructions encoded in a computer readable storage device. When the information encoded in the computer readable storage device are executed by a computer system or processor, it causes one or more processors, computers, or machines to perform certain tasks as described herein. Both the computer readable storage device and the processing hardware/firmware to execute the encoded instructions stored in the storage device are components of system 100. Although the modules shown in FIG. 6 are shown as distinct modules, it should be understood that they may be implemented as fewer or more modules than illustrated. It should also be understood that any of the modules may communicate with one or more components included in system 100, such as server 102, database 104, or clients 106.

At a block 502, different types of noise associated with the circuit are identified. A noise identification and separation module 600 (see FIG. 6) is configured to identify and separate the different types of noise. A noise shape analyzer accepts an input at a given frequency and outputs the response of a noise model of the circuit under consideration to the input. The output comprises a noise power value at the inputted frequency. By applying a series of inputs to the model, each at a different frequency, a corresponding series of noise power values at those different frequencies can be obtained. For example, a frequency sweep at frequencies of 1 Hertz (Hz), 10 Hz, 100 Hz, 1000 Hz, . . . , 1 GHz can be conducted. The corresponding noise power values provide a noise waveform shape from which the different noise types or contributions can be identified by module 600.

In particular, circuits typically have two types of noise sources: flicker-type noise and white-type noise. Flicker-type noise is a noise component that decreases as frequency increases. For example, if a circuit has a fundamental frequency at 1 GHz, its flicker noise decreases mores than a thousand times from the DC band to the first harmonic band. FIG. 7A shows an exemplary waveform 700 representative of the flicker-type noise. The noise strength (noise power value) is large at low frequencies but decreases rapidly as frequency increases. White-type noise, on the other hand, is a noise component that has constant noise strength as a function of frequency. This frequency independent waveform 702 is illustrated in FIG. 7B. White-type noise effectively has infinite bandwidth. Knowing the above shapes for each noise component of the circuit, module 600 identifies the flicker-type noise and white-type noise components of the circuit.

Once the flicker-type noise and white-type noise components are identified, they are separated (block 504) for different computation treatment. (Flicker-type noise and white-type noise may also be referred to as flicker noise and white noise, respectively.) The input noise $S_{in,i}$ in Eq. 1 is decomposed into a flicker noise component $S_{in,flicker,i}$ and a white noise component $S_{in,white,i}$. Next at a block 506, a flicker noise contribution module 602 is configured to calculate an output noise $N_{out,flicker}(\omega)$ attributable to the flicker noise $S_{in,flicker,i}$. Because flicker noise strength decays rapidly as a function of frequency (see FIG. 7A), flicker noise strength becomes negligible after a relatively small number of sidebands. Accordingly, transfer function $H_i$ can be computed for a relatively small number of sidebands rather than a large or infinite number of sidebands.

The output noise $N_{out,flicker}(\omega)$ can be expressed as:

$$N_{out,flicker}(\omega) = \sum_{i=-M}^{M} |H_i(\omega - i\omega_0)|^2 S_{in,flicker,i}(\omega - i\omega_0) \quad \text{(Eq. 2)}$$

where M is the maximum number of sidebands for which the transfer function $H_i$ needs to be computed and $H_i$ is the transfer function $h(t,\omega)$ in the frequency domain. In one embodiment, M=10 is sufficient to determine an accurate output noise associated with the flicker noise. In another embodiment, M may be smaller or slightly larger than 10, such as 6, 7, 12, 15, or around 10. In any case, M need not be a large number, such as 2000, in order to obtain an accurate output noise $N_{out,flicker}(\omega)$. The maximum sideband number can be set to a default or pre-determined value (e.g., M=10) by system 100 so that circuit designers need not concern him or herself with selecting an appropriate maximum sideband number (sub-block 512). Alternatively, the maximum sideband value may be set at run-time depending on the actual decay profile of the flicker noise (known from block 502) (sub-block 512). If the flicker noise for a particular circuit under consideration decays particularly fast, then M may be set to a value less than 10. Conversely if the flicker noise shape decays slower, then M may be set to a value greater than 10 as appropriate for the rate of decay as a function of frequency.

Time-varying transfer function $h(t,\omega)$ obtained in block 208 (see FIG. 2) is in the time domain and is converted to the corresponding harmonic transfer function $H_i(\omega)$ in the frequency domain (sub-block 514). Discrete Fourier transform (DFT) may be used for the conversion. Accordingly, the output noise $N_{out,flicker}(\omega)$ is calculated in the frequency domain as a sum of the multiplication of the transfer function $H_i$ with the corresponding flicker noise $S_i$ at each of the i-th sideband up to, a maximum sideband M (sub-block 516). Because M is not a large number that is at least in the thousands, the number of computations is significantly reduced. For example if M=2000, transfer function $H_i(\omega)$ would need to be computed about 4000 times (for the −2000 to 2000 sidebands) and 4000 multiplication operations are required to obtain the output noise $N_{out,flicker}(\omega)$. Instead, if M=10, about 20 transfer function $H_i(\omega)$ computations and 20 multiplication operations result in the output noise $N_{out,flicker}(\omega)$. Moreover, decomposition of the input noise $S_i$ into simpler waveform components $S_{flicker}$ and $S_{white}$ also facilitates faster computation (e.g., simpler multiplication operations).

If flicker noise $S_{in,flicker,i}$ stems from more than one flicker noise contribution source within the circuit, then a separate transfer function h(t,ω) associated with each of those flicker noise contribution sources is calculated using the recycled Krylov-subspace method described in connection with block 208. For example, in a circuit comprising a plurality of components, a first component may be the source of a first flicker noise contribution, a second component may be the source of a second flicker noise contribution, and a third component may not generate flicker noise at all. In this instance two transfer functions are determined, a first transfer function h(t,ω) for the first flicker noise contribution from the first component and a second transfer function h(t,ω) for the second flicker noise contribution from the second component. For each transfer function h(t,ω) corresponding to a flicker noise contribution source, Eq. 2 is solved using an appropriate value of M in accordance with the noise profile of the corresponding flicker noise contribution (sub-block 518). The output noise $N_{out,flicker}(\omega)$ from each of these flicker noise contribution sources are then summed together (sub-block 520).

Next a white noise contribution module 604 is configured to calculate the output noise attributable to the white noise of the circuit (block 508). The output noise $N_{out,white}(\omega)$ is expressed as:

$$N_{out,white}(\omega) = \sum_{i=-M}^{M} |H_i(\omega - i\omega_0)|^2 S_{in,white,i}(\omega - i\omega_0) \quad \text{(Eq. 3)}$$

where M=infinity.

Since white noise $S_{in,white,i}$ is constant as a function of frequency (see FIG. 7B), Eq. 3 can be rewritten as follows:

$$N_{out,white}(\omega) = S_{in,white,i}(\omega) \sum_{i=-M}^{M} |H_i(\omega - i\omega_0)|^2. \quad \text{(Eq. 4)}$$

The summation in Eq. 4 is an infinite sum (M=infinity) and is converted into the corresponding time domain for ease of calculation. Namely, the summation in the frequency domain is an integration in the time domain:

$$\sum_{i=-\infty}^{+\infty} |H_i(\omega - i\omega_0)|^2 = \frac{1}{T} \int_0^T h^2(t, \omega) dt \quad \text{(Eq. 5)}$$

where T is the periodicity of the circuit, typically a local oscillator frequency of the circuit, and h(t,ω) is the time-varying transfer function of the adjoint LPTV system for a given white noise contribution source of the circuit. Substituting Eq. 5 into Eq. 4, yields the output noise $N_{out,white}(\omega)$ as follows:

$$N_{out,white}(\omega) = S_{in,white,i}(\omega) \frac{1}{T} \int_0^T h^2(t, \omega) dt \quad \text{(Eq. 6)}$$

The above Eq. 6 is calculated using the time-varying transfer function h(t,ω) previously obtained from block 208 (sub-block 522).

For circuits with multiple white noise contribution sources, a separate transfer function h(t,ω) associated with each of those white noise contribution sources is calculated using the recycled Krylov-subspace method described in connection with block 208. For example, in a circuit comprising a plurality of components, a first component may be the source of a first white noise contribution, a second component may be the source of a second white noise contribution, and a third component may not generate white noise at all. In this instance two transfer functions are determined, a first transfer function h(t,ω) for the first white noise contribution from the first component and a second transfer function h(t,ω) for the second white noise contribution from the second component. For each transfer function h(t,ω) corresponding to a white noise contribution source, integration is performed in accordance with Eq. 5 (sub-block 524).

Once all the integrations are complete, they are summed and then multiplied with the constant value of the white noise $S_{in,white,i}$ (see Eq. 6), resulting in the output noise $N_{out,white}(\omega)$ (sub-block 526).

Finally, a total noise module 606 is configured to determine the total output noise $N_{out}(\omega)$ of the circuit (block 510). All of the output noise contributions from the flicker noise and white noise are summed together to yield the total output noise $N_{out}(\omega)$ of the circuit:

$$N_{out}(\omega) = N_{out,flicker}(\omega) + N_{out,white}(\omega) \quad \text{(Eq. 7)}$$

In this manner, a full spectrum Pnoise analysis is performed taking into account the noise from the − infinite sideband to the + infinite sideband. Nevertheless, the computation cost is low without sacrificing accuracy in the output. In traditional Pnoise simulations, Eq. 1 is solved in the frequency domain for a large value of maximum sideband M (such as M=2000), which necessitates extensive use of DFT and tens of thousands of time points over each periodicity of the circuit for the transfer function $H_i$, where i=−M to +M. In contrast, the full spectrum Pnoise analysis uses the integration of Eq. 5, which is several orders of magnitude faster and just as accurate as traditional Pnoise simulations performed using a very large number of sidebands. Thus, the full spectrum Pnoise analysis has about the same computational cost as traditional Pnoise analysis performed with a maximum sideband value of about 10. Most of the computation intensiveness is attributable to the output noise calculation associated with the flicker noise (which is computed using M of about 10). The output noise calculation associated with the white noise, which would otherwise be computationally high to take into account the infinite number of sidebands, is significantly simplified by performing integration calculations in the time domain, which is made possible due to the frequency independence of the white noise.

Figure 8A:
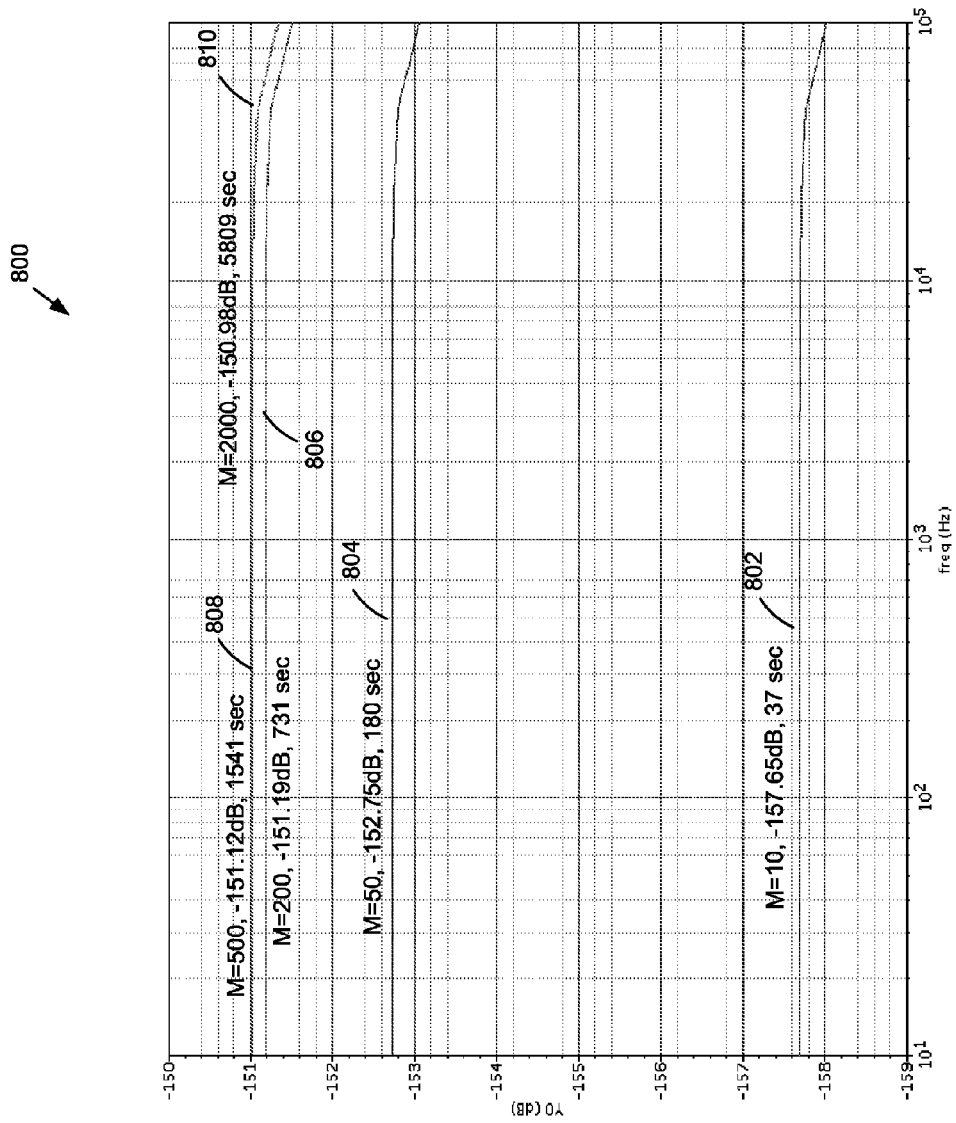
FIGS. 8A-8B illustrates exemplary plots of the total output noise generated from traditional Pnoise simulations and the computationally efficient and accurate Pnoise simulations, respectively.

FIG. 8A illustrates exemplary plots 800 of the total output noise generated from traditional Pnoise simulations for different values of M. The modeled circuit is a switched capacitor circuit, a very simple circuit for illustration purposes. Plots 802, 804, 806, 808, and 810 represent the total output noise of the switched capacitor circuit generated at each of M=10, 50, 200, 500, and 2000, respectively. At M=10, the total output noise is lowest while the simulation time only took 37 seconds. As the maximum sideband number M increases, the total output noise and the time to complete the simulation also increases. This is problematic for several reasons. First, the simulation takes 150 times longer for M=2000 than for M=10. For more complicated circuits, simulations can take days to complete. Second, it is undesirable to get different total output noise values for the same circuit depending on the maximum sideband number selected. Notice that as M increases, the total noise output converges to around −151 dB.

Figure 8B:
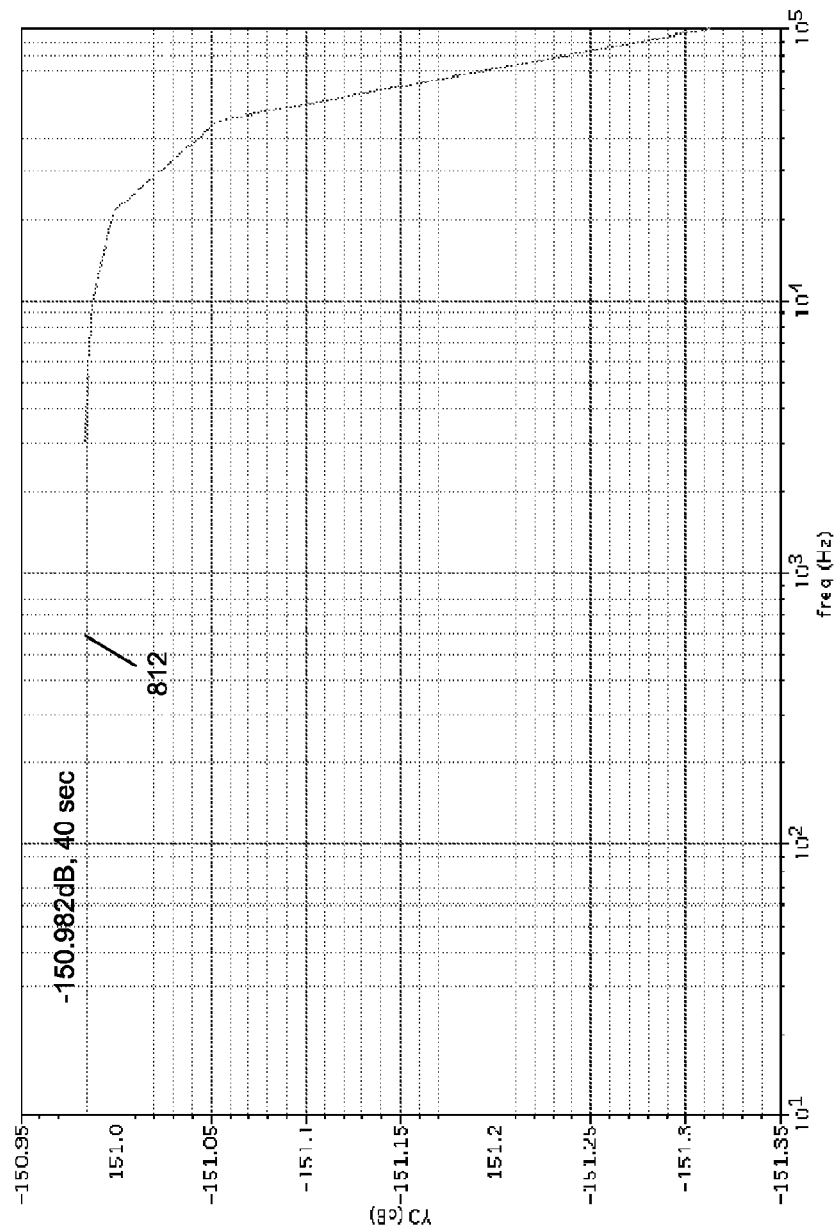

FIG. 8B illustrates an exemplary plot 812 representative of the total output noise generated using the full spectrum Pnoise analysis. The modeled circuit is the same switched capacitor circuit used for the traditional Pnoise simulations of FIG. 8A. It took 40 seconds to complete the full spectrum Pnoise analysis and to return a total output noise of −150.982 dB. The simulation time of 40 seconds is comparable to the 37 seconds for the traditional Pnoise simulation with M=10. The total output noise value of −150.982 dB is comparable to the −150.98 dB for the traditional Pnoise simulation with M=2000. Thus, the full spectrum Pnoise simulation described herein provides an as-accurate total output noise more than 100 times faster than traditional Pnoise simulation.

Figure 9:
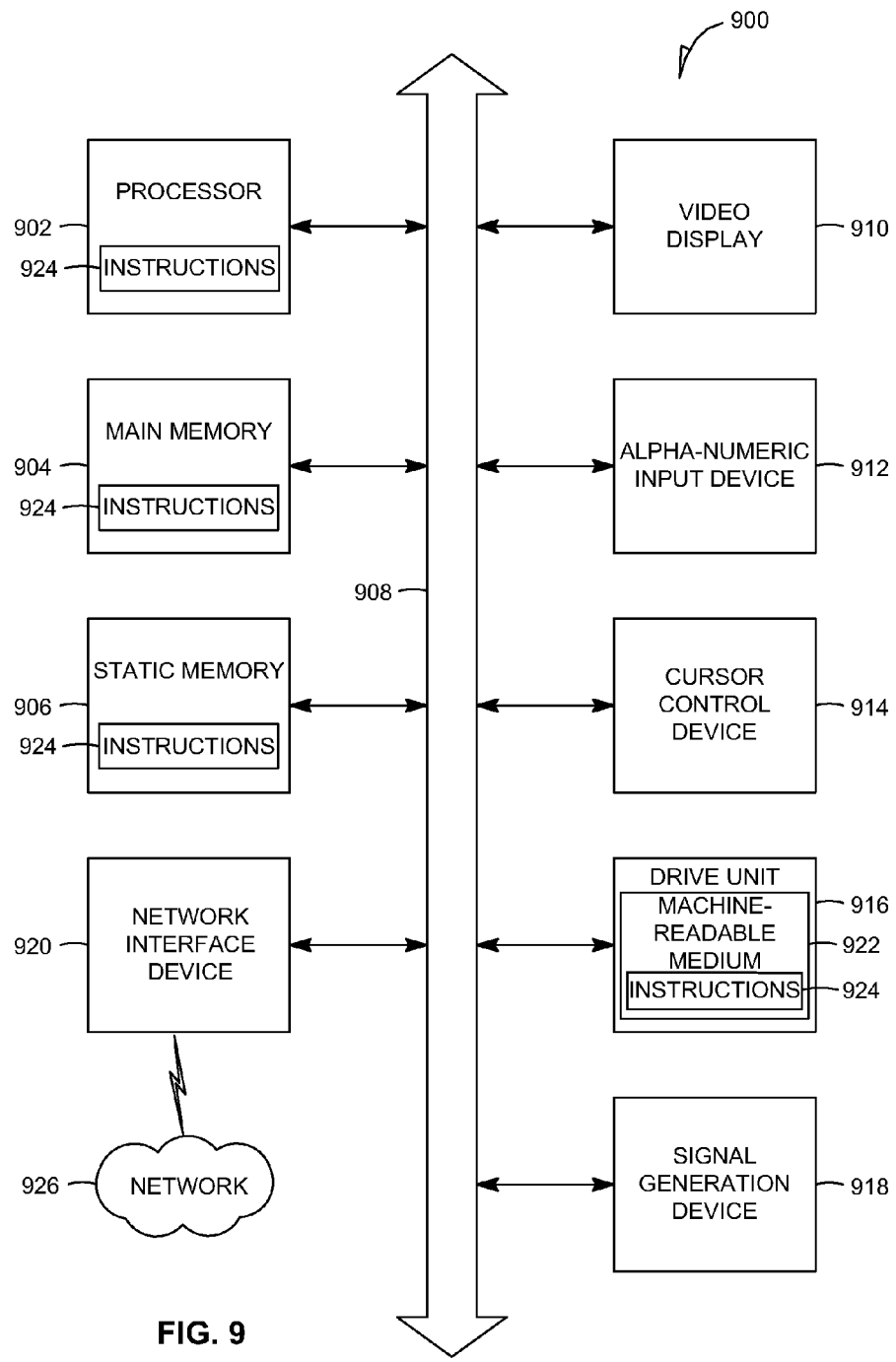
FIG. 9 illustrates a diagrammatic representation of a machine within which a set of instructions, for causing the machine to perform any one or more of the methodologies discussed herein, may be executed according to some embodiments.

FIG. 9 shows a diagrammatic representation of a machine in the example form of a computer system 900 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 900 includes a processor 902 (e.g., a central processing unit (CPU), a graphics processing unit (GPU), or both), a main memory 904 and a static memory 906, which communicate with each other via a bus 908. The computer system 900 may further include a video display unit 910 (e.g., liquid crystal display (LCD) or a cathode ray tube (CRT)). The computer system 900 also includes an alphanumeric input device 912 (e.g., a keyboard), a cursor control device 914 (e.g., a mouse), a disk drive unit 916, a signal generation device 918 (e.g., a speaker) and a network interface device 920.

The disk drive unit 916 includes a machine-readable medium 922 on which is stored one or more sets of instructions (e.g., software 924) embodying any one, or more of the methodologies or functions described herein. The software 924 may also reside, completely or at least partially, within the main memory 904 and/or within the processor 902 during execution thereof by the computer system 900, the main memory 904 and the processor 902 also constituting machine-readable media.

The software 924 may further be transmitted or received over a network 926 via the network interface device 920.

While the machine-readable medium 922 is shown in an example embodiment to be a single medium, the term "machine-readable medium," "computer readable medium," and the like should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

It will be appreciated that, for clarity purposes, the above description describes some embodiments with reference to different functional units or processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. One skilled in the art would recognize that various features of the described embodiments may be combined in accordance with the invention. Moreover, it will be appreciated that various modifications and alterations may be made by those skilled in the art without departing from the spirit and scope of the invention. For example, one or more blocks of flow diagram 500 may be implemented in a different order or simultaneous with each other. Determine flicker noise contribution block 506 may be performed after or simultaneously with the determine white noise contribution block 508. Similarly, parts of flow diagram 200 may be carried out simultaneously with flow diagram 500. For example, the determine transfer function block 208 may be performed after or simultaneously with the noise source identification and separation blocks 502, 504.

What is claimed is:

1. A method for determining a total output noise of a circuit, the method comprising:
   simulating the circuit using information representative of an integrated circuit design corresponding to the circuit to identify an input noise contribution;
   separating, using a processor, the input noise contribution of the circuit into a first noise contribution and a second noise contribution, wherein a first noise profile of the first noise contribution decreases as a function of frequency and a second noise profile of the second noise contribution is constant as a function of frequency;
   determining, using the processor, a first output noise of the circuit using the first noise contribution, wherein the first output noise is determined in a frequency domain;
   determining, using the processor, a second output noise of the circuit using the second noise contribution, wherein the second output noise is determined in a time domain; and
   determining, using the processor, the total output noise of the circuit based on the first output noise and the second output noise.

2. The method of claim 1, wherein the circuit comprises a circuit exhibiting periodic behavior with noise contributions from different sidebands.

3. The method of claim 1, wherein simulating the circuit comprises modeling the circuit as a linear periodical time varying system.

4. The method of claim 1, wherein separating the input noise contribution comprises identifying the first noise contribution and the second noise contribution based on the respective noise profiles.

5. The method of claim 1, wherein determining the first output noise comprises calculating a transfer function of the circuit in the frequency domain for each of a specified number of sidebands.

6. The method of claim 5, wherein the specified number of sidebands comprises a −M to a +M range of sidebands where M is a maximum sideband value.

7. The method of claim 6, wherein the maximum sideband value is 10.

8. The method of claim 5, wherein the transfer function of the circuit differs for each source of the first noise contribution within the circuit.

9. The method of claim 1, wherein determining the second output noise comprises calculating an integration of a transfer function of the circuit in the time domain.

10. The method of claim 9, wherein the transfer function of the circuit differs for each source of the second noise contribution within the circuit.

11. The method of claim 1, wherein determining the total output noise comprises a summation of the first output noise and the second output noise.

12. The method of claim 1, wherein the first noise contribution comprises a flicker-type noise and the second noise contribution comprises a white-type noise.

13. A system, comprising:
    a storage device encoded with information representative of an integrated circuit design and at least one transfer function corresponding to the integrated circuit design; and
    a computing device, in communication with the storage device, and configured to run a simulation using the information representative of the integrated circuit design to identify an input noise contribution and during the simulation to:
        decompose the input noise contribution attributable to the integrated circuit design into at least a flicker noise contribution and a white noise contributions;
        determine a flicker noise output based on the flicker noise contribution and the at least one transfer function, wherein the flicker noise output is determined in a frequency domain;
        determine a white noise output based on the white noise contribution and the at least one transfer function, wherein the white noise output is determined in a time domain; and
        calculate a total noise output based on the flicker noise output and the white noise output, wherein the total noise output comprises a response of the information representative of the integrated circuit design to the input noise contribution applied to the information representative of the integrated circuit design.

14. The system of claim 13, wherein the information representative of the integrated circuit design comprises a linear periodical time varying model of a circuit represented by the integrated circuit design.

15. The system of claim 13, wherein the integrated circuit design comprises a radio frequency (RF) circuit design.

16. The system of claim 13, wherein the at least one transfer function is generated using a recycled Krylov-subspace method.

17. The system of claim 13, wherein the computing device is configured to convert the at least one transfer function into the frequency domain for each sideband in a range of sidebands.

18. The system of claim 17, wherein the range of sidebands comprises a −10th to +10th sidebands.

19. The system of claim 17, wherein the range of sidebands is a pre-determined range.

20. The system of claim 17, wherein the computing device is configured to determine the range of sidebands in accordance with a decay profile of the flicker noise contribution.

21. The system of claim 13, wherein the computing device is configured to determine at least a first source and a second source within the information representative of the integrated circuit design associated with at least a first portion and a second portion of the white noise contribution, respectively, wherein each of the first and second sources represent a different device within the integrated circuit design.

22. The system of claim 21, wherein the computing device is configured to obtain a first transfer function corresponding to the first source and a second transfer function corresponding to the second source.

23. The system of claim 22, wherein the computing device is configured to calculate a first integration of the first transfer function from a negative infinity sideband to a positive infinity sideband.

24. The system of claim 23, wherein the computing device is configured to calculate a second integration of the second transfer function from the negative infinity sideband to the positive infinity sideband, and wherein a sum of the calculated first integration and the calculated second integration comprises the white noise output.

25. A non-transitory computer readable medium including instructions, which when executed by a processor, cause the processor to perform operations comprising:
    generating a first noise output of a model representative of a circuit over a certain number of sidebands, wherein the first noise output is associated with a first Pnoise contribution of the circuit and the first Pnoise contribution has a first profile that decreases as a function of frequency, wherein the certain number of sidebands is determined in accordance with a decay rate of the first profile;
    generating a second noise output of the model representative of the circuit over a negative infinity sideband to a positive infinity sideband, wherein the second noise output is associated with a second Pnoise contribution of the circuit and the second Pnoise contribution has a second profile that is constant as a function of frequency; and
    generating a Pnoise output of the model representative of the circuit using the first noise output and the second noise output.

26. The computer readable medium of claim 25, wherein the first Pnoise contribution comprises flicker noise and the second Pnoise contribution comprises white noise.

27. The computer readable medium of claim 25, wherein generating the first noise output is performed in a frequency domain.

28. The computer readable medium of claim 25, further comprising instructions, which when executed by the processor, cause the processor to convert a transfer function of the circuit from a time domain to a frequency domain using Discrete Fourier Transform (DFT).

29. The computer readable medium of claim 25, wherein generating the second noise output is performed in a time domain.

30. The computer readable medium of claim 25, wherein the first Pnoise contribution and the second Pnoise contribution together comprise an internal small signal noise of the circuit.

31. The computer readable medium of claim 25, wherein at least one of the first noise output and the second noise output is generated based on a transfer function of the circuit.

32. The computer readable medium of claim 25, wherein the circuit comprises a radio frequency (RF) circuit.

33. The computer readable medium of claim 25, wherein the model representative of the circuit comprises a linear periodical time varying circuit.

\* \* \* \* \*